US012610620B2

(12) United States Patent     (10) Patent No.:   US 12,610,620 B2

Wang et al.     (45) Date of Patent:   Apr. 21, 2026

(54) DRIVING BACK PLATE, DISPLAY PANEL, AND PREPARATION METHOD THEREFOR

(71) Applicant: CHENGDU VISTAR OPTOELECTRONICS CO., LTD., Chengdu (CN)

(72) Inventors: Yan Wang, Chengdu (CN); Fei Huang, Chengdu (CN); Jiye Xia, Chengdu (CN); Cuicui Sheng, Chengdu (CN); Xianrui Qian, Chengdu (CN); Chenggong Wang, Chengdu (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 632 days.

(21) Appl. No.: 18/170,149

(22) Filed: Feb. 16, 2023

(65) Prior Publication Data

US 2023/0197735 A1    Jun. 22, 2023

Related U.S. Application Data

(63) Continuation of application No. PCT/CN2021/113847, filed on Aug. 20, 2021.

(30) Foreign Application Priority Data

Nov. 3, 2020    (CN) .......................... 202011211454.5

(51) Int. Cl.
*H10D 86/60*     (2025.01)
*H10D 86/40*     (2025.01)
       (Continued)

(52) U.S. Cl.
CPC ........... *H10D 86/60* (2025.01); *H10D 86/441* (2025.01); *H10H 20/857* (2025.01);
       (Continued)

(58) Field of Classification Search
CPC .... H10D 86/60; H10D 86/441; H10D 86/021; H10D 86/451; H01L 22/22;
       (Continued)

(56) References Cited

U.S. PATENT DOCUMENTS 9,252,375 B2    2/2016   Bibl et al.
10,679,911 B2    6/2020   Pappas et al.
       (Continued)

FOREIGN PATENT DOCUMENTS

CN    101587680 A    11/2009
CN    104751760 A    7/2015
       (Continued)

OTHER PUBLICATIONS

Office Action issued on Nov. 7, 2023, in corresponding Japanese Application No. 2023-509823, 10 pages.
       (Continued)

*Primary Examiner* — Tan N Tran
(74) *Attorney, Agent, or Firm* — Maier & Maier, PLLC

(57) ABSTRACT

A driving back plate, a display panel, and a preparation method therefor. The driving back plate includes a plurality of pixel driving units. At least one of the pixel driving units includes a main electrode pair and at least one redundant electrode pair. A second electrode of the main electrode pair, a first electrode of the main electrode pair, a first electrode of a redundant electrode pair, and a second electrode of the redundant electrode pair are arranged sequentially in a first direction. At least one of the pixel driving units includes a connection line. The connection line includes a cutting portion. A signal on the connection line is configured to be input between the redundant electrode pair and the cutting portion.

17 Claims, 10 Drawing Sheets

(51) Int. Cl.

| | |
|---|---|
| *H10H 20/857* | (2025.01) |
| *H10P 74/00* | (2026.01) |
| *H10W 90/00* | (2026.01) |
| *H10H 20/01* | (2025.01) |

(52) U.S. Cl.

CPC ........... *H10P 74/232* (2026.01); *H10W 90/00* (2026.01); *H10H 20/0364* (2025.01)

(58) Field of Classification Search

CPC . H01L 25/167; H01L 25/0753; H10H 20/857; H10H 20/0364; H10H 29/142; G09F 9/33; H10P 74/232; H10W 90/00

See application file for complete search history.

(56) References Cited

U.S. PATENT DOCUMENTS

| | | | | |
|---|---|---|---|---|
| 12,261,260 | B2 * | 3/2025 | Shimizu | ............... H10H 29/142 |
| 2011/0032442 | A1 | 2/2011 | Van Aerle et al. | |
| 2011/0102331 | A1 | 5/2011 | Philipp | |
| 2014/0346475 | A1 | 11/2014 | Cho et al. | |
| 2019/0157340 | A1 * | 5/2019 | Liao | ........................ G09G 3/006 |
| 2019/0172760 | A1 | 6/2019 | Hsiang et al. | |

FOREIGN PATENT DOCUMENTS

| | | |
|---|---|---|
| CN | 107750377 A | 3/2018 |
| CN | 107978620 A | 5/2018 |
| CN | 108133942 A | 6/2018 |
| CN | 108230991 A | 6/2018 |
| CN | 208014703 U | 10/2018 |
| CN | 110365279 A | 10/2019 |
| CN | 111312730 A | 6/2020 |
| JP | H02165125 A | 6/1990 |
| JP | 2005173523 A | 6/2005 |
| JP | 2009134233 A | 6/2009 |
| JP | 2019215564 A | 12/2019 |
| JP | 2020025033 A | 2/2020 |
| JP | 2020154117 A | 9/2020 |
| KR | 950014951 A | 6/1995 |
| KR | 101581368 B1 | 12/2015 |
| KR | 1020180004247 A | 1/2018 |
| TW | 200727736 A | 7/2007 |

OTHER PUBLICATIONS

Chinese Office Action issued on May 22, 2023, in corresponding Chinese Application No. CN2020112114545, 4 pages.

International Search Report mailed Nov. 26, 2021, in International Application No. PCT/CN2021/113847, 4 pages.

Office Action issued on Aug. 18, 2022, in corresponding Japanese Application No. 202011211454.5 , 29 pages.

Office Action issued on Jul. 14, 2024, in corresponding Korean Application No. 10-2023-7005536, 9 pages.

\* cited by examiner

1032/103

1031/103

104

1040

1021/102

201

101

1022/102

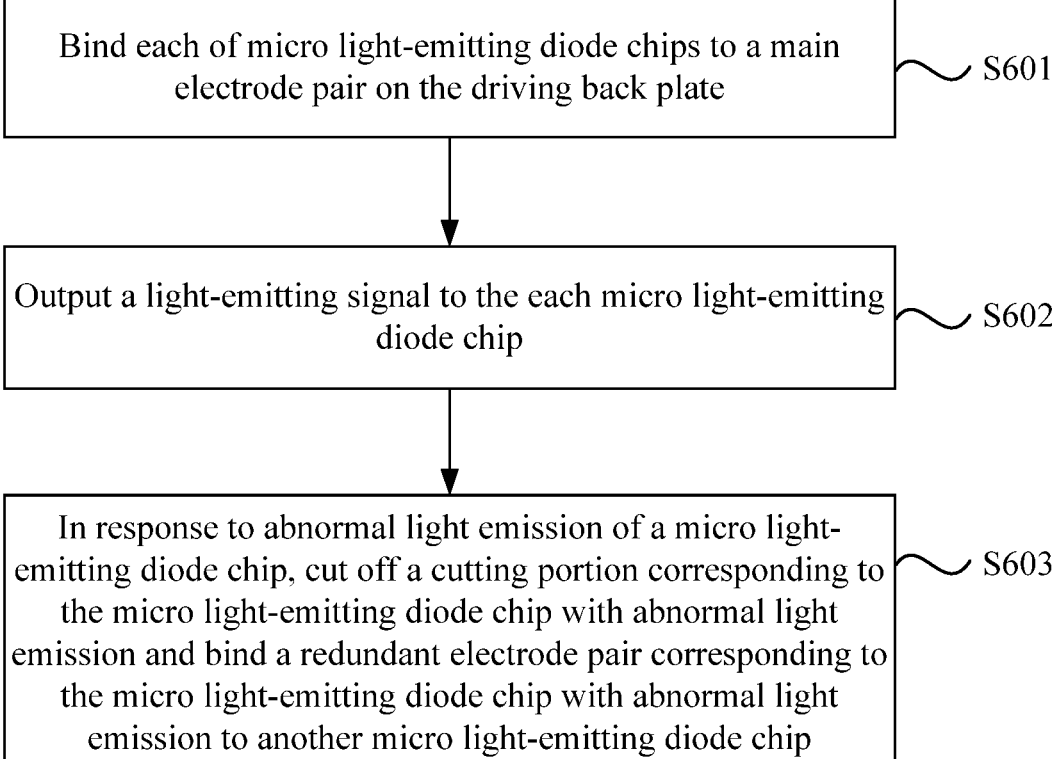

Bind each of micro light-emitting diode chips to a main electrode pair on the driving back plate ~ S601

Output a light-emitting signal to the each micro light-emitting diode chip ~ S602

In response to abnormal light emission of a micro light-emitting diode chip, cut off a cutting portion corresponding to the micro light-emitting diode chip with abnormal light emission and bind a redundant electrode pair corresponding to the micro light-emitting diode chip with abnormal light emission to another micro light-emitting diode chip ~ S603

DRIVING BACK PLATE, DISPLAY PANEL, AND PREPARATION METHOD THEREFOR

CROSS-REFERENCE TO RELATED APPLICATIONS

This application is a continuation of International Patent Application No. PCT/CN2021/113847, filed on Aug. 20, 2021, which claims priority to Chinese Patent Application No. 202011211454.5 filed on Nov. 3, 2020, the disclosures of both of which are incorporated herein by reference in their entireties.

TECHNICAL FIELD

Embodiments of the present application relate to display technology, for example, a driving back plate, a display panel, and a preparation method therefor.

BACKGROUND

With the development of display technology, display panels, such as micro light-emitting diode (micro-LED) display panels, are more and more widely used, and correspondingly, the requirement for the yield of display panels is getting higher and higher.

A micro light-emitting diode display panel includes a driving back plate and micro light-emitting diode chips. The yield of micro light-emitting diode chips is relatively low. When a display panel is prepared, a redundancy repair scheme is usually adopted, that is, two positions are reserved for two micro light-emitting diode chips in each sub-pixel on the driving back plate. When a first micro light-emitting diode chip is defective, the wire of the first micro light-emitting diode chip is cut off, and a micro light-emitting diode chip of the same type is added at the redundant position.

However, in the driving back plate adopting the redundancy repair scheme, the area occupied by each sub-pixel is relatively large, that is, the redundancy repair scheme is applicable only to driving back plates with low pixels per inch (PPI) and not applicable to driving back plates with high PPI.

SUMMARY

This application provides a driving back plate, a display panel, and a preparation method therefor to reduce the area of each pixel driving unit in the driving back plate so that the redundancy repair scheme can be applied to driving back plates with high PPI.

In a first aspect, an embodiment of this application provides a driving back plate. The driving back plate includes a plurality of pixel driving units arranged in an array. At least one pixel driving unit of the plurality of pixel driving units each includes a main electrode pair and at least one redundant electrode pair. The main electrode pair and the at least one redundant electrode pair are each configured to be bound to a micro light-emitting diode chip. For the main electrode pair and a redundant electrode pair of the at least one redundant electrode pair of the at least one pixel driving unit, a second electrode of the main electrode pair, a first electrode of the main electrode pair, a first electrode of a redundant electrode pair, and a second electrode of the redundant electrode pair are arranged sequentially in a first direction. The at least one pixel driving unit each includes a connection line extending in the first direction. The connection line is electrically connected to the first electrode of the main electrode pair and the first electrode of the redundant electrode pair respectively. The connection line includes a cutting portion. A signal on the connection line is configured to be input between the redundant electrode pair and the cutting portion.

In a second aspect, an embodiment of this application provides a display panel. The display panel includes the driving back plate according to the first aspect and a plurality of micro light-emitting diode chips. A micro light-emitting diode chip of the plurality of micro light-emitting diode chips is bound to a corresponding main electrode pair or a corresponding redundant electrode pair.

In a third aspect, an embodiment of this application provides a preparation method for a display panel. The method includes the steps below.

Each micro light-emitting diode chip of a plurality of micro light-emitting diode chips is bound to a main electrode pair on the driving back plate. The driving back plate includes a plurality of pixel driving units arranged in an array and at least one pixel driving unit of the plurality of pixel driving units each includes a main electrode pair and at least one redundant electrode pair. The main electrode pair and the at least one redundant electrode pair are configured to be bound to a micro light-emitting diode chip. For the main electrode pair and a redundant electrode pair of the at least one redundant electrode pair of the at least one pixel driving unit, a second electrode of the main electrode pair, a first electrode of the main electrode pair, a first electrode of a redundant electrode pair, and a second electrode of the redundant electrode pair are arranged sequentially in a first direction. The at least one pixel driving unit each includes a connection line extending in the first direction. The connection line is electrically connected to the first electrode of the main electrode pair and the first electrode of the redundant electrode pair respectively. The connection line includes a cutting portion. A signal on the connection line is configured to be input between the redundant electrode pair and the cutting portion.

A light-emitting signal is output to the plurality of micro light-emitting diode chips.

And in response to abnormal light emission of a micro light-emitting diode chip of the plurality of micro light-emitting diode chips, a cutting portion corresponding to the micro light-emitting diode chip with abnormal light emission is cut off and a redundant electrode pair corresponding to the micro light-emitting diode chip with abnormal light emission is bound to another micro light-emitting diode chip.

BRIEF DESCRIPTION OF DRAWINGS

FIG. 12 is a flowchart of a preparation method for a display panel according to an embodiment of this application.

DETAILED DESCRIPTION

This application is described below in conjunction with drawings and embodiments.

As mentioned above, the redundancy repair scheme in the related art does not apply to driving back plates with high PPI.

Figure 1:
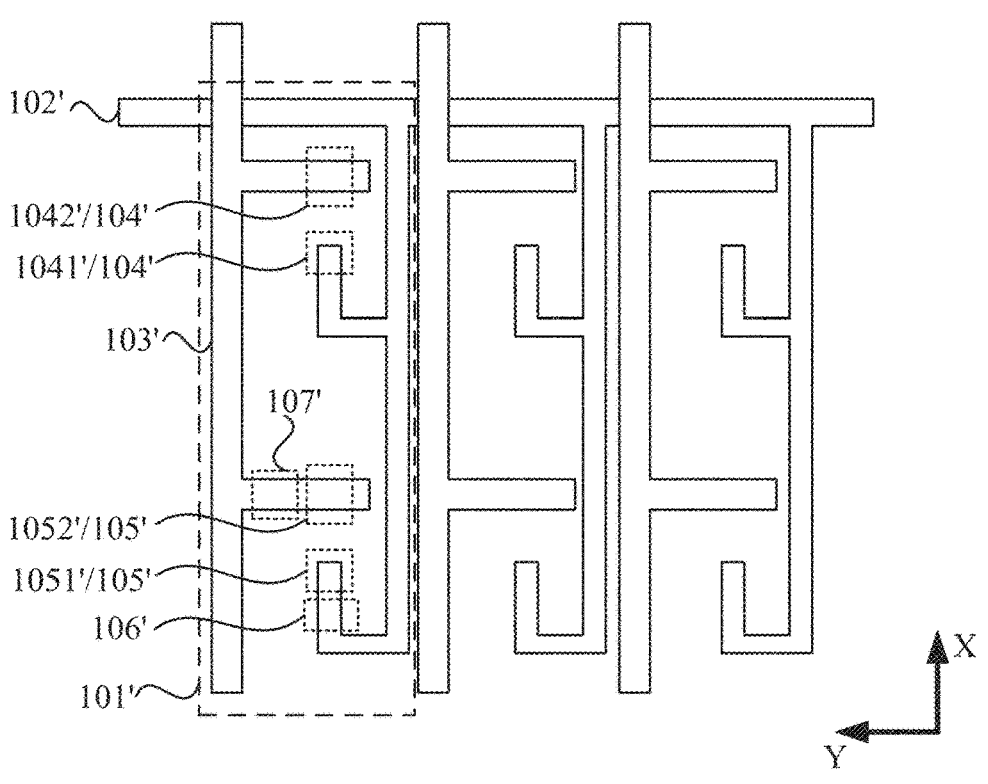
FIG. 1 is a diagram illustrating a structure of a driving back plate according to the related art.

FIG. 1 is a diagram illustrating a structure of a driving back plate in the related art. With reference to FIG. 1, the driving back plate includes a plurality of pixel driving units 101' arranged in an array. Each pixel driving unit 101' includes a main electrode pair 105' and a redundant electrode pair 104'. The driving back plate also includes a plurality of first electrode wires 102' and a plurality of second electrode wires 103'. The redundant electrode pair 104' includes a first electrode 1041' and a second electrode 1042'. The main electrode pair 105' includes a first electrode 1051' and a second electrode 1052'. In FIG. 1, in a driving back plate of the related art, the first electrode 1041' of the redundant electrode pair and the first electrode 1051' of the main electrode pair are both electrically connected to the first electrode wire 102'; the second electrode 1052' of the main electrode pair and the second electrode 1042' of the redundant electrode pair are both electrically connected to the second electrode wire 103'; and the first electrode 1051' of the main electrode pair, the second electrode 1052' of the main electrode pair, the first electrode 1041' of the redundant electrode pair, and the second electrode 1042' of the redundant electrode pair are arranged sequentially, for example, in a first direction X. When the driving back plate is bound to micro light-emitting diode chips, the micro light-emitting diode chips are first bound to the main electrode pair 105' and then the micro light-emitting diode chips are tested. If the micro light-emitting diode chip is a defective pixel, the first connection line 106' between the main electrode pair 105' and the first electrode wire 102' and/or the second connection line 107' between the main electrode pair 105' and the second electrode wire 103' is cut off, and then a micro light-emitting diode chip of the same type is bound to the redundant pair 104' to achieve redundancy repair. However, the main electrode pair 105' and the redundant electrode pair 104' in the driving back plate are applicable only to low PPI scenarios because a certain distance is needed between the main electrode pair 105' and the redundant electrode pair 104' so that the region corresponding to the pixel driving unit 101' can bind two Micro Light-Emitting- Diodes. Therefore, to reserve a position for the connection lines, it is necessary to increase the length of the pixel driving unit 101' in the first direction X so that the first connection line 106' between the main electrode pair 105' and the first electrode wire 102' is long enough, or it is necessary to enlarge the width of the pixel driving unit 101' perpendicular to the first direction X so that the second connection line 107' between the main electrode pair 105' and the second electrode wire 103' is long enough. As a result, the area of the pixel driving unit 101' is relatively large, which does not apply to high PPI scenarios.

In view of the working conditions occurring in the driving back plate in the above-mentioned related art, this application proposes the following driving back plate, display panel, and preparation method for the display panel.

Figure 2:
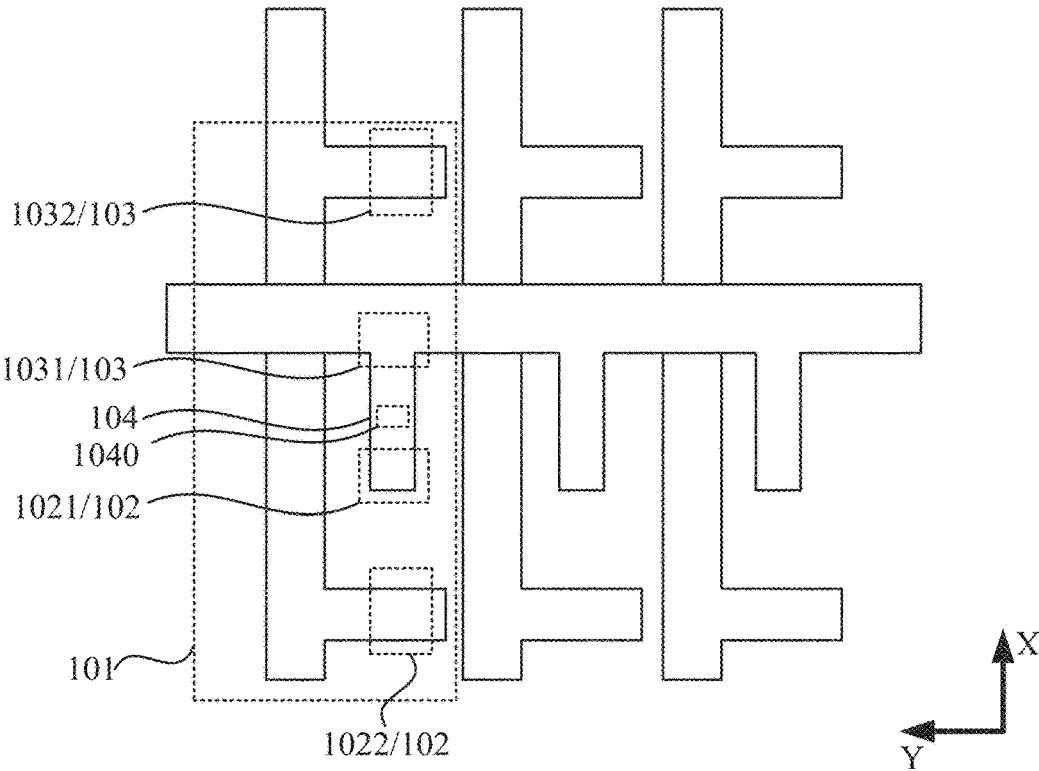
FIG. 2 is a diagram illustrating a structure of a driving back plate according to an embodiment of this application.

FIG. 2 is a diagram illustrating a structure of a driving back plate according to an embodiment of this application. With reference to FIG. 2, a driving back plate includes a plurality of pixel driving units 101 arranged in an array. At least one pixel driving unit of the plurality of pixel driving units 101 each includes a main electrode pair 102 and at least one redundant electrode pair 103. The main electrode pair 102 and the at least one redundant electrode pair 103 are each configured to be bound to a micro light-emitting diode chip. For the main electrode pair 102 and the any redundant electrode pair 103 of the at least one pixel driving unit 101, a second electrode 1022 of the main electrode pair 102, a first electrode 1021 of the main electrode pair 102, a first electrode 1031 of the redundant electrode pair 103, and a second electrode 1032 of the redundant electrode pair 103 are arranged sequentially in a first direction X. The at least one pixel driving unit 101 each includes a connection line 104 extending in the first direction X. The connection line 104 is electrically connected to the first electrode 1021 of the main electrode pair 102 and the first electrode 1031 of the redundant electrode pair 103 respectively. The connection line 104 includes a cutting portion 1040. A signal on the connection line 104 is configured to be input between the redundant electrode pair 103 and the cutting portion 1040.

In FIG. 2, a signal on the connection line 104 is configured to be input between the first electrode 1031 of redundant electrode pair 103 and the cutting portion 1040.

For example, the driving back plate may be of a micro light-emitting diode display panel. A driving back plate of a micro light-emitting diode display panel may include a substrate and a multi-layer functional layer which may be, for example, a metal layer, an insulating layer, or a semiconductor layer. A driving back plate includes a plurality of pixel driving units arranged in an array. The pixel driving unit in this embodiment refers to the region on the driving back plate correspondingly bound to the micro light-emitting diode chip. The main electrode pair 102 may be a portion of a wire connected to the main electrode pair 102 and the redundant electrode pair 103 may be a portion of a wire connected to the redundant electrode pair 103. For example, the first electrode 1021 of the main electrode pair 102 and the first electrode 1031 of the redundant electrode pair 103 are a portion of a connection line. The main electrode pair 102 and the redundant electrode pair 103 are exposed on the outside of the driving back plate to bind with the micro light-emitting diode chips. In other embodiments, a pad may be provided on the surface of the main electrode pair 102 and the redundant electrode 103 to facilitate the binding to micro light-emitting diode chips. Alternatively, the electrode of the electrode pair is not the same wire as the wire connected to the electrode. For example, the first electrode 1021 of the main electrode pair 102 does not belong to the connection line 104, but is a structure independent of the connection line 104. In this embodiment, both the main electrode pair 102 and the redundant electrode pair 103 may be configured to be a portion of the wire connected to the main electrode pair 102 or the redundant electrode pair 103 so that the preparation process is less, thereby saving the process cost.

For one pixel driving unit, the first electrode 1021 of the main electrode pair 102 and the first electrode 1031 of the redundant electrode pair 103 are located inside the pixel driving unit. The second electrode 1022 of the main electrode pair 102 and the second electrode 1032 of the redundant electrode pair 103 are located outside the pixel driving unit. In other words, the second electrode 1022 of the main electrode pair 102 is located on a side of the first electrode 1021 of the main electrode pair 102 away from the first electrode 1031 of the redundant electrode pair 103, and the second electrode 1032 of the redundant electrode pair 103 is located on a side of the first electrode 1031 of the redundant electrode pair 103 away from the first electrode 1021 of the main electrode pair 102. Two ends of the connection line 104 are also served as the first electrode 1021 of the main electrode pair 102 and the first electrode 1031 of the redundant electrode pair 103. The first electrode 1021 of the main electrode pair 102 and the first electrode 1031 of the redundant electrode pair 103 are input with the same signal, such as a signal required for the anode of the micro light-emitting diode chip, or a signal required for the cathode of the micro light-emitting diode chip. The first electrode 1021 of the main electrode pair 102 and the first electrode 1031 of the redundant electrode pair 103 are configured to be bound to the same electrode as that of the micro light-emitting diode chip, for example, both are bound to the anode or the cathode.

Figure 3:
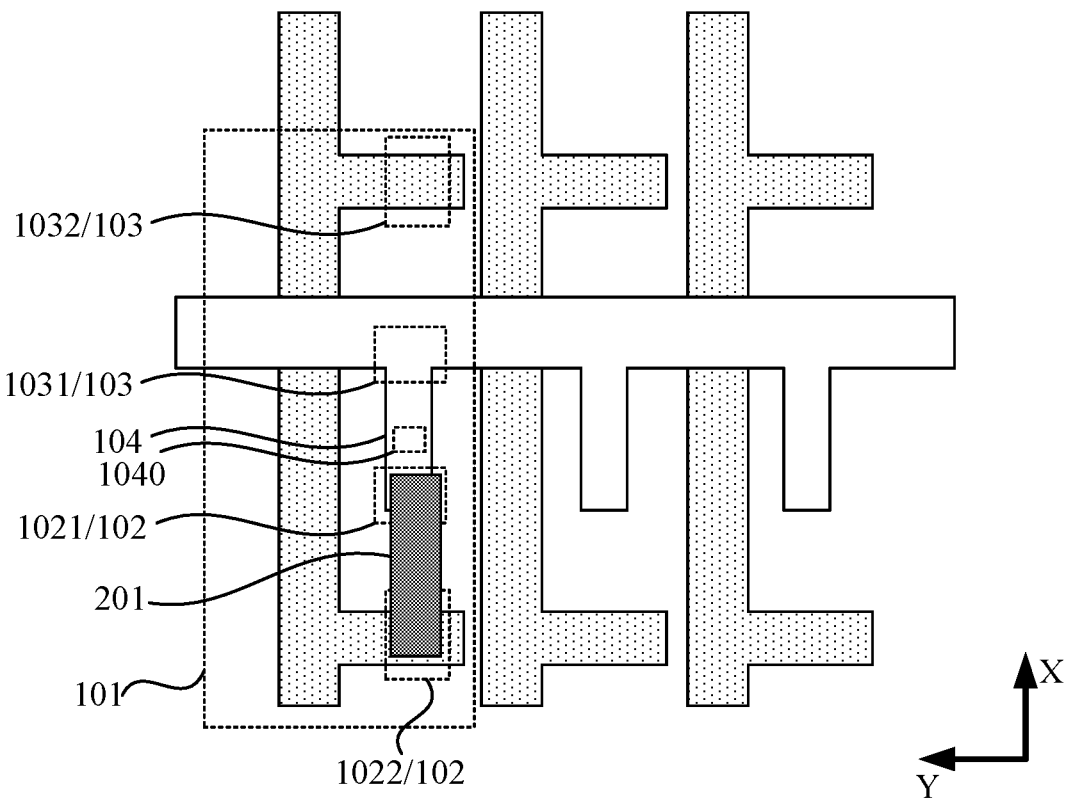
FIG. 3 is a diagram illustrating a structure in which a micro light-emitting diode chip is bound to a driving back plate according to an embodiment of this application.

FIG. 3 is a diagram illustrating a structure in which a micro light-emitting diode chip is bound to a driving back plate according to an embodiment of this application. In FIG. 3, when a display panel is prepared, the micro light-emitting diode chip 201 is first bound to the main electrode pair 102. The cutting portion 1040 on the connection line 104 is configured to be cut off when the micro light-emitting diode chip 201 corresponding to the main electrode pair 102 is detected to work abnormally, so as to prevent the micro light-emitting diode chip 201 corresponding to the main electrode pair 102 from continuing to work, for example, work with abnormal light emission and lead to a reduced display quality. The position and size of the cutting portion 1040 are not limited by the embodiment of this application, but it is necessary to ensure that the signal on the connection line 104 is configured to be input between the cutting portion 1040 and the redundant electrode pair 103. When the cutting portion 1040 is cut off, the signal on the connection line 104 cannot be output to the micro light-emitting diode chip 201 corresponding to the main electrode pair 102, thereby avoiding abnormal display. At the same time, the signal on the connection line 104 can still be output to the micro light-emitting diode chip 201 corresponding to the redundant electrode pair 103, thereby ensuring that the micro light-emitting diode chip 201 corresponding to the redundant electrode pair 103 can work normally. When the display panel is prepared, the micro light-emitting diode chip 201 is first bound to the main electrode pair 102. In this situation, the connection line 104 has a conductive path, so the signal on the connection line 104 can be transmitted to the micro light-emitting diode chip 201 corresponding to the main electrode pair 102. If the micro light-emitting diode chip 201 is a defective pixel, then the connection line 104 is cut off.

In this situation, the signal on the connection line 104 cannot be transmitted to the micro light-emitting diode chip 201 corresponding to the main electrode pair 102 and a micro light-emitting diode chip 201 of the same type is bound to the corresponding redundant electrode pair 103 to realize redundancy repair. A certain interval has to be configured between the main electrode pair 102 and the redundant electrode pair 103. In this embodiment, the connection line 104 is provided between the main electrode pair 102 and the redundant electrode pair 103. In this manner, it is not necessary to increase the length of the pixel driving unit 101 in the first direction X to provide a connection line at a position corresponding to the second electrode 1022 of the main electrode pair 102 (for example, the region adjacent to the second electrode 1022 in the black dotted box in FIG. 3) or at a position corresponding to the second electrode 1032 of the redundant electrode pair 103 (for example, the adjacent region of the second electrode 1032 in the black dot box in FIG. 3). Nor is it necessary to enlarge the width of the pixel driving unit in a direction perpendicular to the first direction to provide a connection line at a position corresponding to the second electrode 1022 of the main electrode pair 102 (for example, a left position of the second electrode 1022 in the black dotted box in FIG. 3) or at a position corresponding to the second electrode 1032 of the redundant electrode pair 103 (for example, a left position of the second electrode 1032 in the black dotted box in FIG. 3). Therefore, the area of the pixel driving unit 101 is relatively small, which applies to high PPI scenarios.

In this embodiment, the second electrode 1022 of the main electrode pair 102, the first electrode 1021 of the main electrode pair 102, the first electrode 1031 of the redundant electrode pair 103, and the second electrode 1032 of the redundant electrode pair 103 may be located in the same line or a certain misalignment may occur. The micro light-emitting diode chip 201 may be a red micro light-emitting diode chip, a green micro light-emitting diode chip, or a blue micro light-emitting diode chip. The micro light-emitting diode chip of the same type means the micro light-emitting diode chip with the same emitted light color.

The driving back plate adopted by this application includes a plurality of pixel driving units arranged in an array. At least one pixel driving unit of the pixel driving units each includes a main electrode pair and at least one redundant electrode pair. The main electrode pair and the at least one redundant electrode pair are each configured to be bound to a micro light-emitting diode chip. For the main electrode pair and any one of the redundant electrode pair of the at least one pixel driving unit, a second electrode of the main electrode pair, a first electrode of the main electrode pair, a first electrode of a redundant electrode pair, and a second electrode of the redundant electrode pair are arranged sequentially in a first direction. The at least one pixel driving unit each includes a connection line extending in the first direction. The connection line is electrically connected to the first electrode of the main electrode pair and the first electrode of the redundant electrode pair respectively. The connection line includes a cutting portion. A signal on the connection line is configured to be input between the redundant electrode pair and the cutting portion. The connection line is provided between the main electrode pair and the redundant electrode pair so that it is not necessary to increase the length of the pixel driving unit in the first direction to provide a connection line at a position corresponding to the second electrode of the main electrode pair or at a position corresponding to the second electrode of the redundant electrode pair; nor is it necessary to enlarge the width of the pixel driving unit in a direction perpendicular to the first direction to provide a connection line at a position corresponding to the second electrode of the main electrode pair or at a position corresponding to the second electrode of the redundant electrode pair. Therefore, the area of the pixel driving unit 101 is relatively small, which applies to high PPI scenarios. At the same time, the complexity of routing in the driving back plate is also relatively low, which helps to reduce the preparation difficulty of the driving back plate.

Figure 4:
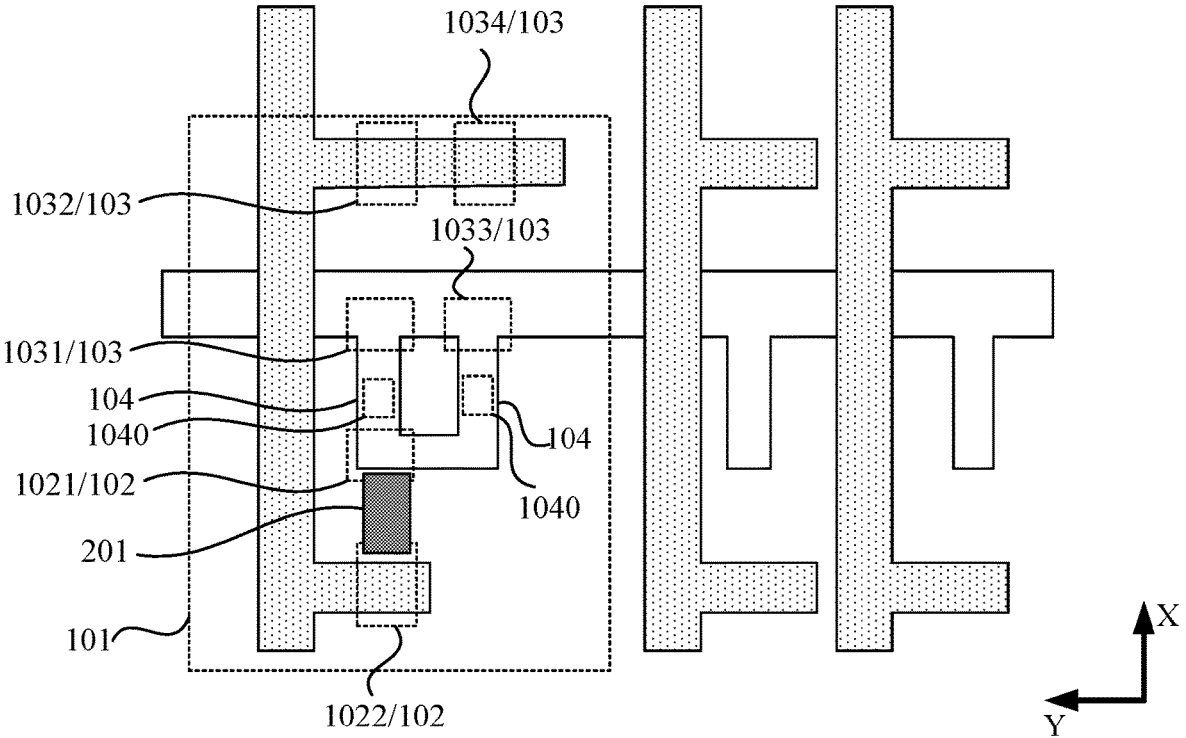
FIG. 4 is a diagram illustrating a structure of another driving back plate according to an embodiment of this application.
Figure 5:
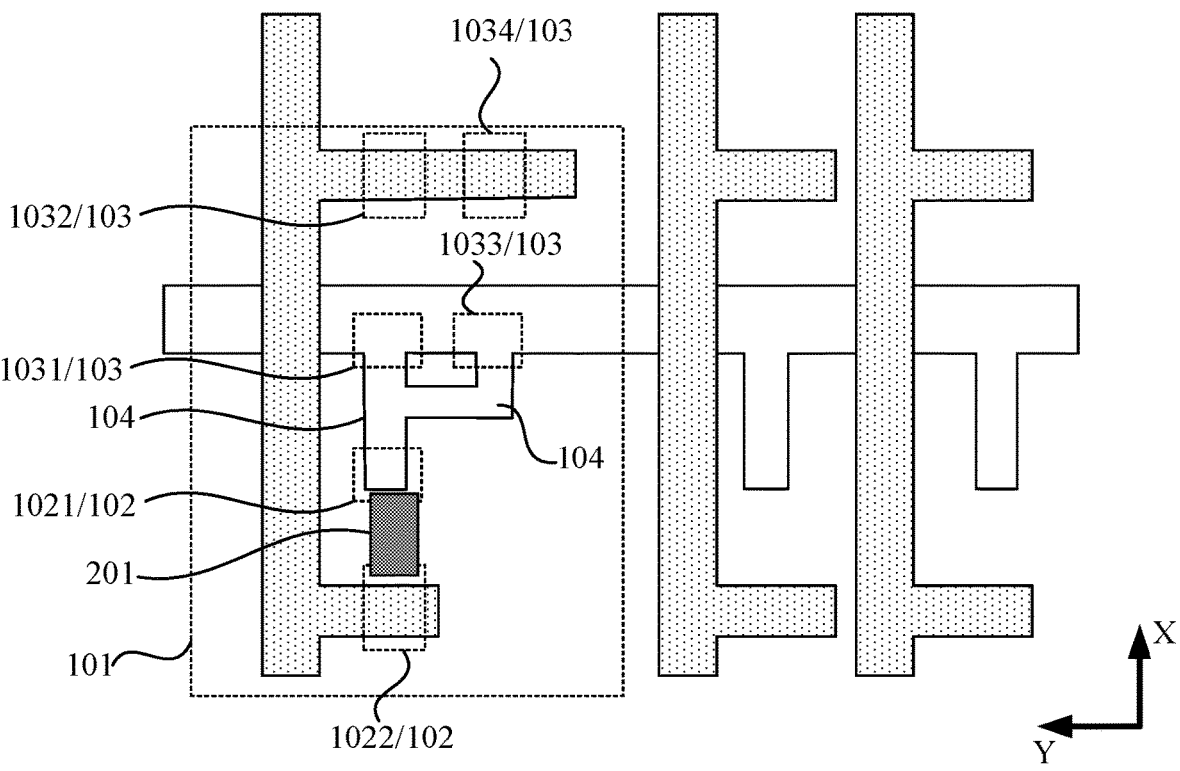
FIG. 5 is a diagram illustrating a structure of another driving back plate according to an embodiment of this application.

FIG. 2 and FIG. 3 illustrate an example in which at least one pixel driving unit each includes a main electrode pair and a secondary electrode pair. FIG. 4 is a diagram illustrating a structure of another driving back plate according to an embodiment of this application. In FIG. 4, the at least one pixel driving unit 101 each includes a main electrode pair 102 and a plurality of redundant electrode pairs 103 such as a first redundant electrode pair and a second redundant electrode pair. The first redundant electrode pair includes correspondingly a first electrode 1031 and a second electrode 1032. The second redundant electrode pair includes correspondingly a first electrode pair 1033 and a second electrode 1034. Each redundant electrode pair 103 corresponds to a connection line 104. Therefore, when the micro light-emitting diode chip 201 corresponding to the main electrode pair 102 is a defective pixel, any one of the redundant electrode pairs 103 may be selected, the corresponding cutting portion 1040 is cut off, and another micro light-emitting diode chip 201 is bound to realize redundancy repair. In FIG. 4, an example is illustrated in which the connection lines 104 corresponding to the first redundant electrode pair and the second redundant electrode pair are served as the first electrode of the main electrode pair 102, but it is not limited thereto. FIG. 5 is a diagram illustrating a structure of another driving back plate according to an embodiment of the present application. In FIG. 5, the connection line 104 corresponding to the second redundant electrode pair is connected to the connection line 104 corresponding to the first redundant electrode pair. For example, the connection line 104 corresponding to the second redundant electrode pair is connected to a portion of the connection line 104 corresponding to the first redundant electrode pair located between the main electrode pair 102 and the first redundant electrode pair. In this embodiment of this application, the configuration of the main electrode pair 102 and the redundant electrode pair 103 is performed in the at least one pixel driving unit 101. It can be understood that the configuration may be performed in one pixel driving unit 101, or in multiple driving units 101, or in each pixel driving unit 101. In another embodiment of this application, the configuration may also be performed only in one pixel driving unit 101 prone to defective pixels so that repair is better facilitated and process waste is avoided.

Figure 6:
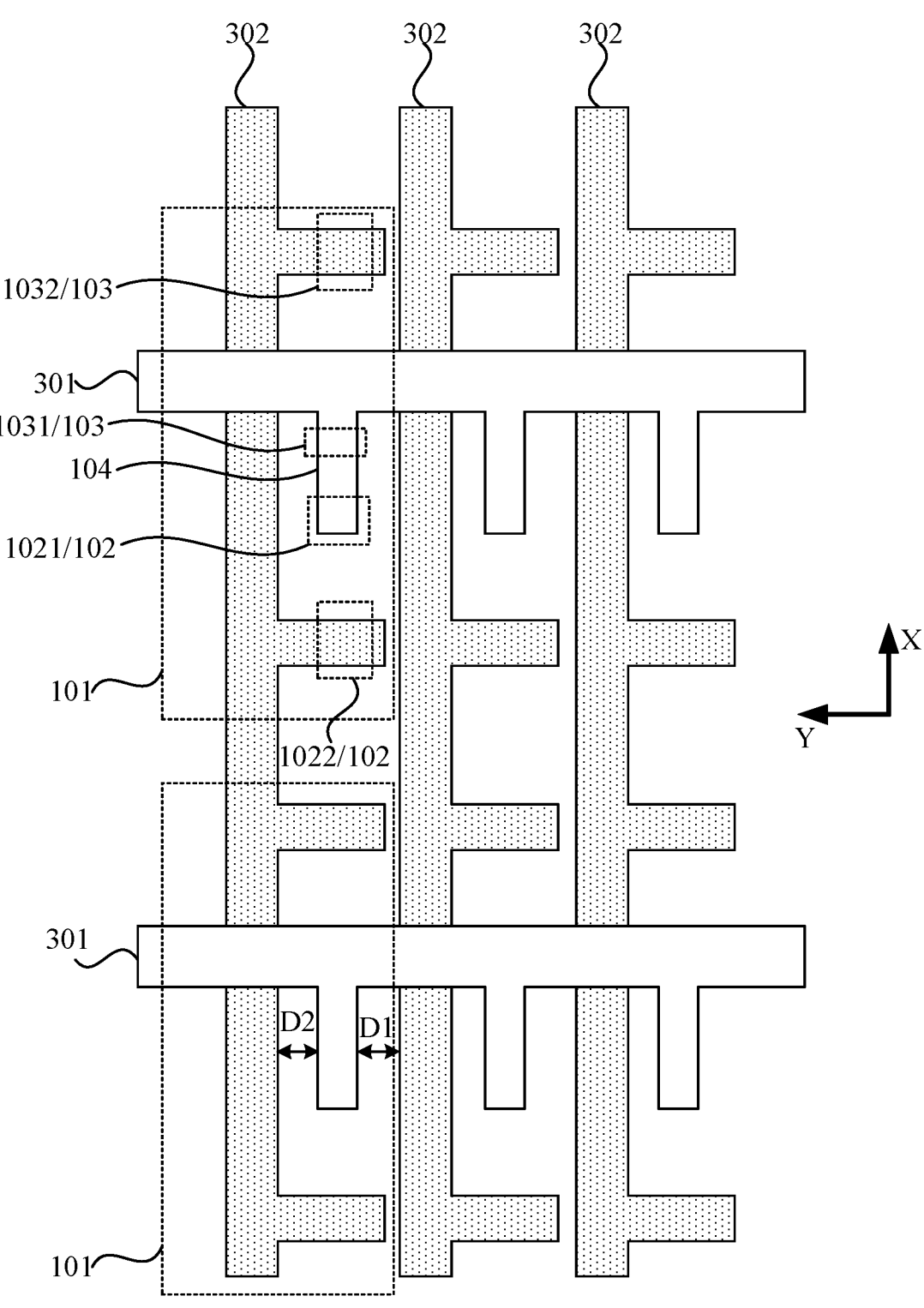
FIG. 6 is a diagram illustrating a structure of another driving back plate according to an embodiment of this application.

In an embodiment, FIG. 6 is a diagram illustrating a structure of another driving back plate according to an embodiment of this application. With reference to FIG. 6, the plurality of pixel driving units 101 are arranged in pixel columns in a first direction X and arranged in pixel rows in a second direction Y. The driving back plate includes a plurality of first electrode wires 301 extending in the second direction Y and a plurality of second electrode wires 302 extending in the first direction X. Among the pixel driving units 101, connection lines 104 of pixel driving units 101 in a same row of the pixel rows are connected to a same first electrode wire 301 and connection lines 104 of pixel driving units 101 in different rows are connected to different first electrode wires 301. The first electrode 1031 of the redundant electrode pair 103 is electrically connected to the first electrode wire 301. The signal on the connection line 104 is input by the first electrode wire 301. Among the pixel driving units 101, second electrodes 1022 of main electrode pairs 102 and second electrodes 1032 of redundant electrode pairs 103 in pixel driving units 101 in a same column are both electrically connected to a same second electrode wire 302. Second electrodes 1022 of main electrode pair 102 in pixel driving units 101 in different columns are electrically connected to different second electrode wires 302. Second electrodes 1032 of the redundant electrode pairs 103 in pixel driving units 101 in different columns are electrically connected to different second electrode wires 302.

For example, in this embodiment, the first electrode wire 301 extends in the second direction Y, and the second electrode wire 302 extends in the first direction X. Each row of pixel driving units 101 corresponds to one first electrode wire 301 and each column of pixel driving units 101 corresponds to one second electrode wire 302. The first electrode wire 301 provides a driving signal to the first electrodes of each row of pixel driving units 101. The first electrodes of each row of pixel driving units 101 include the first electrode 1021 of the main electrode pair 102 and the first electrode 1031 of the redundant electrode pair 103. The second electrode wire 302 provides a driving signal to the second electrodes of each column of pixel driving units 101. The second electrodes of each column of pixel driving units 101 include the second electrode 1022 of the main electrode pair 102 and the second electrode 1032 of the redundant electrode pair 103. When a driving signal is provided on a first electrode wire 301 and a second electrode wire 302, the micro light-emitting diode chip corresponding to the pixel driving unit 101 emits light, that is, passive matrix (PM) drive mode is realized. The connection line 104 and the first electrode wire 301 may be integrated and the second electrode and the second electrode wire 302 may be integrated.

In an embodiment, with continued reference to FIG. 6, in a thickness direction of the driving back plate, the range of the ratio of a distance between an orthographic projection of the connection line 104 and an orthographic projection of a second electrode wire 302 adjacent to the connection line 104 to a distance between an orthographic projection of the connection line 104 and an orthographic projection of another second electrode wire 302 adjacent to the connection line 104 is 0.1 to 10.

For example, when the second electrode wires 302 are disposed on both sides of the connection line 104, a distance D1 between the connection line 104 and the second electrode wire 302 on the right and a distance D2 between the connection line 104 and the second electrode wire 302 on the left may be configured. The range of the ratio of D1 to D2 is 0.1 to 10. In this manner, the connection line 104 is relatively far away from the second electrode wires 302 on both sides and the second electrode wires 302 are not easily cut during cutting, thereby increasing the yield of the driving back plate. At the same time, the requirements for the accuracy of D1 and D2 are lower, thereby helping to reduce the production cost.

In an embodiment, in a thickness direction of the driving back plate, the range of the ratio of a distance between an orthographic projection of the connection line 104 and an orthographic projection of a second electrode wire 302 adjacent to the connection line 104 to a distance between an orthographic projection of the connection line 104 and an orthographic projection of another second electrode wire 302 adjacent to the connection line 104 is 0.3 to 10/3. Since the difference between D1 and D2 is relatively small, the second electrode wires 302 on both sides are less easily cut when the cutting portion 1040 on the connection line 104 is cut. In addition, the distance between an orthographic projection of the connection line 104 and an orthographic projection of a second electrode wire 302 adjacent to the connection line 104 may be configured to be the same as the distance between an orthographic projection of the connection line 104 and an orthographic projection of another second electrode wire 302 adjacent to the connection line 104 so that D1 and D2 are the same and neither the second electrode wires 302 to the left of the connection line 104 nor the second electrode wires 302 to the right of the connection line 104 are easily cut at the time of cutting. The specific values of D1 and D2 may be configured according to the process level. If the process level is high, D1 and D2 may be configured to be the same. When the process conditions are poor, the range of the ratio of D1 to D2 may be configured to be as small as possible.

It can be understood that the second electrode wire 302 may only exist on one side of the pixel column located at the edge of the driving back plate. In this situation, the distance between the corresponding connection line 104 and the second electrode wire 302 may also be configured to be the same as the distance D1.

Figure 7:
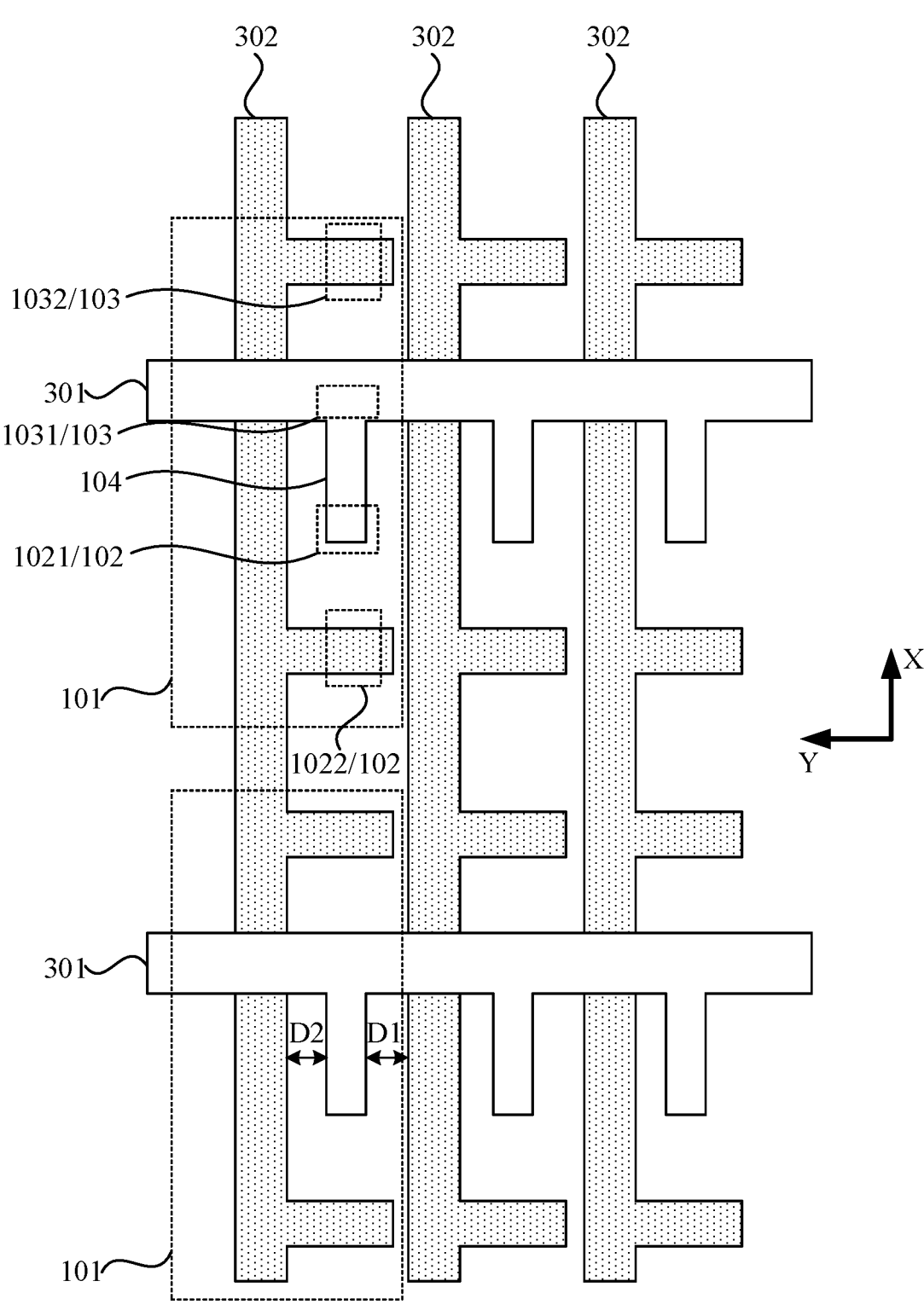
FIG. 7 is a diagram illustrating a structure of another driving back plate according to an embodiment of this application.

In an embodiment, FIG. 7 is a diagram illustrating a structure of another driving back plate according to an embodiment of this application. With reference to FIG. 7, a portion of the first electrode wire 301 is served as the first electrode electrically connected to the first electrode wire 301.

For example, the portion between the first electrode 1031 of the redundant electrode pair 103 and the first electrode wire 301 cannot be cut. In this embodiment, the region in the pixel driving unit can be utilized to the maximum so that the length of the connection line 104 is maximized and the corresponding first electrode is less easily damaged during the cutting, thereby increasing the yield of the driving back plate and further increasing the yield of the display panel.

Figure 8:
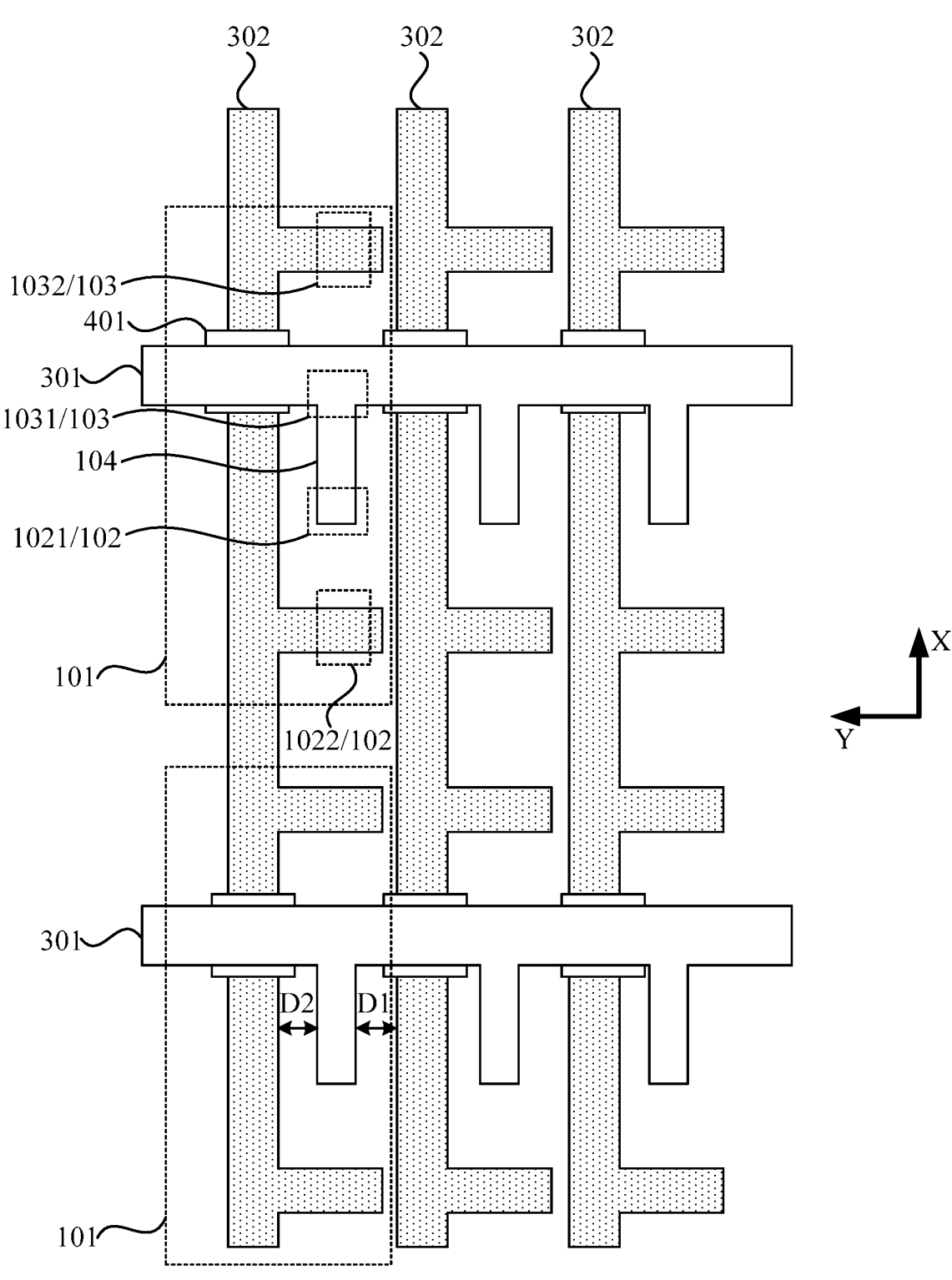
FIG. 8 is a diagram illustrating a structure of another driving back plate according to an embodiment of this application.

In an embodiment, FIG. 8 is a diagram illustrating a structure of another driving back plate according to an embodiment of this application. With reference to FIG. 8, the first electrode wires 301 and the second electrode wires 302 are arranged in a same layer. The driving back plate further includes an insulating layer 401 at an overlap between the first electrode wire 301 and the second electrode wire 302. The insulating layer 401 may be utilized to avoid a short circuit between the first electrode wire 301 and the second electrode wire 302.

Figure 9:
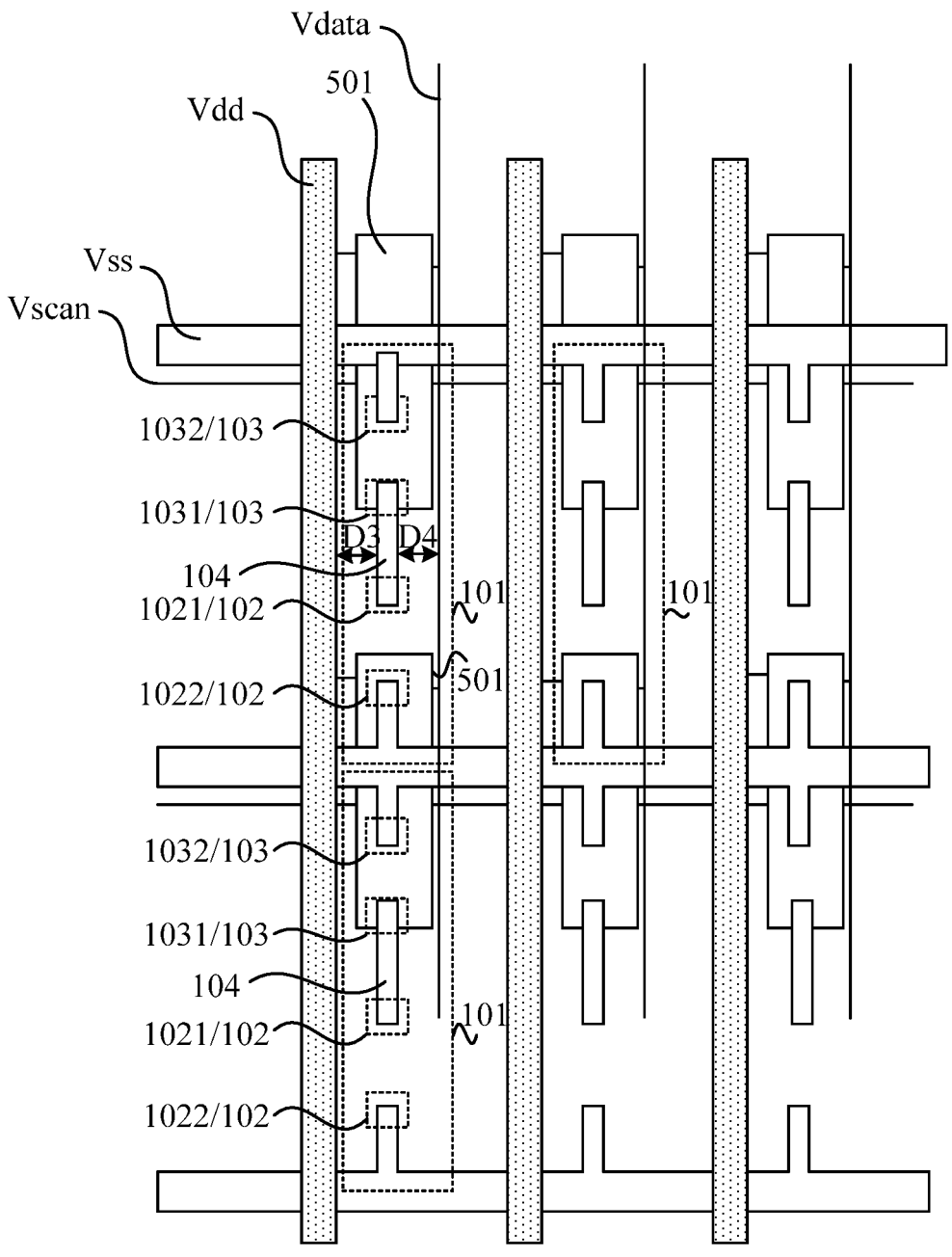
FIG. 9 is a diagram illustrating a structure of another driving back plate according to an embodiment of this application.

FIG. 9 is a diagram illustrating a structure of another driving back plate according to an embodiment of this application. With reference to FIG. 9, the driving back plate further includes a plurality of pixel driving circuits 501 in one-to-one correspondence with pixel driving units 101. The first electrode 1031 of the redundant electrode pair 103 is electrically connected to a corresponding pixel driving circuit 501.

For example, the display panel formed by binding the driving back plate and micro light-emitting diode chips may also be driven by active matrix (AM), that is, each micro light-emitting diode chip may emit light continuously and independently. The pixel driving circuit 501 may be, for example, a pixel driving circuit including a driving transistor, a switching transistor, and a storage capacitor, which is also commonly referred to as a "2T1C" pixel driving circuit in the field. In some other embodiments, a pixel driving circuit including seven transistors and a storage capacitor and with a threshold compensation function may also be adopted, which is also often referred to as a "7T1C" pixel driving circuit in the field. The specific circuit structure and working principle of the pixel driving circuit are well known to those skilled in the art, and are not repeated herein. In this embodiment, the connection line 104 is electrically connected to the pixel driving circuit 501 so that the first electrode receives the driving signal provided by the pixel driving circuit 501. The first electrode is, for example, configured to be bound to the anode of the micro light-emitting diode chip. The second electrode may be electrically connected to the common electrode on the driving back plate. The second electrode is configured to be bound to the cathode of the micro light-emitting diode chip. When the preparation of the driving back plate is completed, the main electrode pair 102 may be bound to the micro light-emitting diode chip first. The signal output by the pixel driving circuit 501 is input to the first electrode 1021 of the main electrode pair 102 after passing through the first electrode 1031 of the redundant electrode pair 103 so that the signal output by the pixel driving circuit 501 can be transmitted to the micro light-emitting diode chip corresponding to the main electrode pair 102. If a defective pixel exists in the micro light-emitting diode chip, the connection line 104 is cut off, and a micro light-emitting diode chip of the same type is bound to the corresponding redundant electrode pair 103 so that the driving signal output by the pixel driving circuit 501 can still be input to the micro light-emitting diode chip corresponding to the redundant electrode pair 103 through the first electrode 1031 of the redundant electrode pair 103, but cannot be input to the micro light-emitting diode chip corresponding to the main electrode pair 102 through the connection line 104, thereby preventing the light emission of the micro light-emitting diode chip corresponding to the main electrode pair 102 from affecting the display panel.

When the pixel driving unit includes a plurality of redundant electrode pairs 103, each pixel driving unit may be provided with a pixel driving circuit, and each redundant electrode pair 103 is connected to the pixel driving circuit 501 in the same manner.

Figure 10:
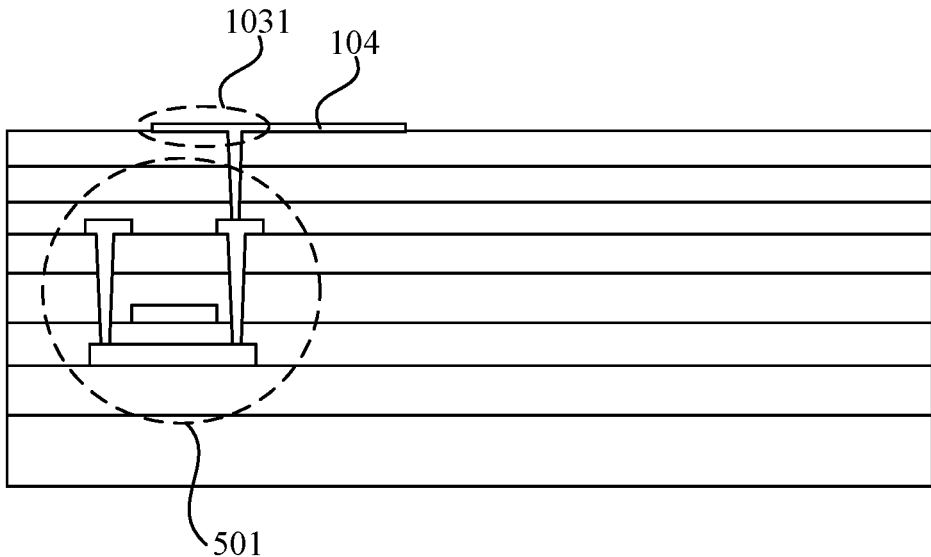
FIG. 10 is a diagram illustrating a layer structure of a driving back plate according to an embodiment of this application.

In an embodiment, FIG. 10 is a diagram illustrating a layer structure of a driving back plate according to an embodiment of this application. The layer structure of the driving back plate in FIG. 10 may correspond to the driving back plate in FIG. 9. In connection with FIGS. 9 and 10, in a thickness direction of the driving back plate, an orthographic projection of the connection line 104 and an orthographic projection of a corresponding pixel driving circuit 501 are at least partially non-overlapping.

For example, in FIG. 9, in this embodiment, the orthographic projection of a pixel driving circuit 501 in the row does not completely overlap the orthographic projection of the connection line 104 in the row. In other words, the pixel driving circuit 501 in the row does not completely overlap the orthographic projection of the electrode pairs in the row, but rather a certain "misalignment" exists. When the display panel is formed by binding the driving back plate to the micro light-emitting diode chip, since the position of the electrode pair corresponds to that of the micro light-emitting diode chip, a "misalignment" between the orthographic projection of the pixel driving circuit 501 in the row and the orthographic projection of the electrode pair in the row may exist in this embodiment, that is, a "misalignment" between the orthographic projection of the pixel driving circuit 501 in the row and the orthographic projection of the micro light-emitting diode chip may exist. If the orthographic projection of the connection line 104 completely overlaps the orthographic projection of the corresponding pixel driving circuit 501, the risk of laser cutting the pixel driving circuit 501 is relatively high, thereby damaging the driving back plate. In this embodiment, the orthographic projection of the connection line 104 and the orthographic projection of the corresponding pixel driving circuit 501 may not overlap at least partially, and the non-overlapping region may be cut at the time of cutting so that the driving back plate is not damaged, thereby increasing the yield of the driving back plate and further increasing the yield of the display panel. In addition, the orthographic projection of the portion of the connection line 104 that is not the first electrode 1031 of the redundant electrode pair 103 may not overlap the corresponding orthographic projection of the pixel driving circuit 501 so that more parts on the connection line 104 can be utilized for cutting, thereby helping to reduce the cutting difficulty.

In an embodiment, the driving back plate includes a plurality of signal lines extending in the first direction X. In a thickness direction of the driving back plate, the range of the ratio of a distance between an orthographic projection of the connection line 104 and an orthographic projection of a signal line adjacent to the connection line 104 to a distance between an orthographic projection of the connection line 104 and an orthographic projection of another signal line adjacent to the connection line 104 is 0.1 to 10.

For example, in FIG. 9, the driving back plate may include a plurality of signal lines extending in the first direction X. If the first direction is in the column direction, the signal lines may include, for example, the first power line Vdd and the data line Vdata. The driving back plate may also include a plurality of signal lines extending in the second direction Y. If the second direction is in the row direction, the signal lines may include, for example, the second power line Vss or the scanning line Vscan. The first power line Vdd is configured to provide the first power signal to the pixel driving circuit 501 and the second power line Vss is configured to provide the second power signal to the micro light-emitting diode chip. The second power signal is a common power signal. For example, the voltage value of the first power signal is different from that of the second power signal. The scanning line Vscan is configured to provide scanning signals to the pixel driving circuit 501. The data line Vdata is configured to provide data signals to the pixel driving circuit 501. In this embodiment, the distance between an orthographic projection of the connection line 104 and an orthographic projection of a signal line adjacent to the connection line 104 may be configured to be the same as the distance between an orthographic projection of the connection line 104 and an orthographic projection of another signal line adjacent to the connection line 104. For example, when the left side of the connection line 104 is adjacent to the first power line Vdd and the right side of the connection line 104 is adjacent to the data line Vdata, the distance D3 between the orthographic projection of the connection line 104 and the orthographic projection of the first power line Vdd and the distance D4 between the orthographic projection of the connection line 104 and the orthographic projection of the data line Vdata may be configured. The range of the ratio of D3 to D4 is 0.1 to 10. Therefore, when the connection line 104 is cut, neither the first power line Vdd nor the data line Vdata 302 is easily cut at the time of cutting, thereby increasing the yield of the driving back plate and further increasing the yield of the display panel. In addition, the range of the ratio of D3 to D4 may be 0.3 to 10/3 so that it is less likely to cut the first power line Vdd and the data line Vdata. In addition, D3 may be the same as D4. The specific values of D3 and D4 may be configured according to the process level. If the process level is high, D3 and D4 may be configured to be the same. When the process conditions are poor, the range of the ratio of D3 and D4 may be configured to be as small as possible.

In FIG. 9, in the thickness direction of the display panel, a certain overlap between the orthographic projection of the pixel driving unit in a row and the orthographic projection of the pixel driving circuit corresponding to the pixel driving unit in the next row may exist. For example, the orthographic projection of the second electrode of the main electrode pair corresponding to the pixel driving unit in a row overlaps the orthographic projection of the driving circuit corresponding to the pixel driving unit in the next row. Such configuration makes the arrangement of the pixel driving unit and the pixel driving circuit on the driving back plate more compact, thereby facilitating high PPI display.

Figure 11:
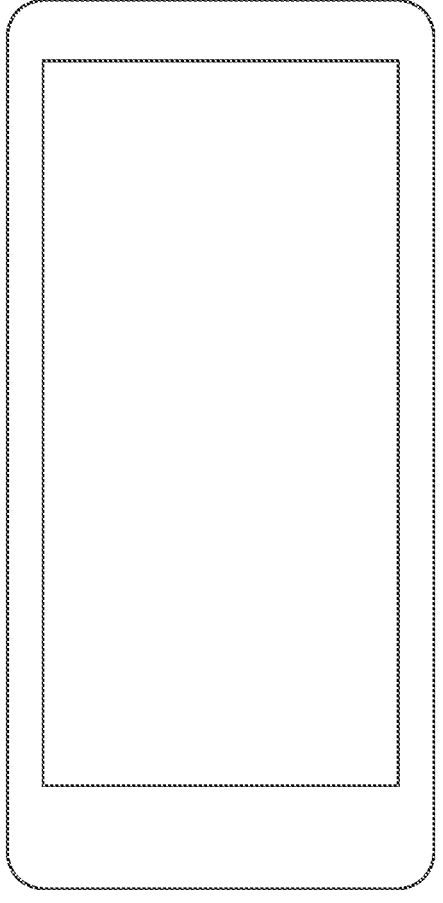
FIG. 11 is a diagram illustrating a structure of a display panel according to an embodiment of this application.

FIG. 11 is a diagram illustrating a structure of a display panel according to an embodiment of this application. With reference to FIG. 11, a display panel includes the driving back plate and a plurality of micro light-emitting diode chips according to any embodiment of the present application. The micro light-emitting diode chip is bound to a corresponding main electrode pair or to a corresponding redundant electrode pair.

For example, the display panel may be on a mobile phone, a tablet computer, a smart watch, a car display, MP3, MP4, or other wearable devices. Since the display panel includes the driving back plate according to any embodiment of the application, it has the same beneficial effects as well, and details are not repeated herein. The micro light-emitting diode chips include a red micro light-emitting diode chip, a green micro light-emitting diode chip, a blue micro light-emitting diode chip, and the like so that the display panel realizes full-color display. In other embodiments, the micro light-emitting diode chips may only include a blue micro light-emitting diode chip. By providing quantum dot materials at corresponding positions, the light emitted by the blue-light micro light-emitting diode chip can be changed into red light or green light, thereby realizing a full-color display.

FIG. 12 is a flowchart of a preparation method for a display panel according to an embodiment of the present application. With reference to FIG. 12, the method includes S601 to S603.

In S601, each of micro light-emitting diode chips is bound to a main electrode pair on the driving back plate.

The driving back plate includes a plurality of pixel driving units arranged in an array and at least one pixel driving unit of the plurality of pixel driving units each includes a main electrode pair and at least one redundant electrode pair. The main electrode pair and the at least one redundant electrode pair are configured to be bound to a micro light-emitting diode chip. For the main electrode pair and any one redundant electrode pair of the at least one pixel driving unit, a second electrode of the main electrode pair, a first electrode of the main electrode pair, a first electrode of a redundant electrode pair, and a second electrode of the redundant electrode pair are arranged sequentially in a first direction. The at least one pixel driving unit each includes a connection line extending in the first direction. The connection line is electrically connected to the first electrode of the main electrode pair and the first electrode of the redundant electrode pair respectively. The connection line includes a cutting portion. A signal on the connection line is a configured to be input between the redundant electrode pair and the cutting portion.

For the working principle of the driving back plate, reference may be made to the description of the driving back plate in the present application, and details are not repeated herein.

In S602, a light-emitting signal is output to the plurality of micro light-emitting diode chips.

For example, the driving back plate may be controlled to output a driving signal to the first electrode, and at the same time, output a driving signal to the second electrode. If the corresponding micro light-emitting diode chip is in a normal state, the micro light-emitting diode chip emits light normally.

In S603, in response to abnormal light emission of a micro light-emitting diode chip, a cutting portion corresponding to the micro light-emitting diode chip with abnormal light emission is cut off and a redundant electrode pair corresponding to the micro light-emitting diode chip with abnormal light emission is bound to another micro light-emitting diode chip.

For example, if the micro light-emitting diode chip corresponding to the main electrode pair emits light abnormally, for example, emits no light or emits light with insufficient brightness, it indicates that the micro light-emitting diode chip is a defective pixel. The corresponding connection line may be cut off and a micro light-emitting diode chip of the same type may be bound to the corresponding redundant electrode pair. The corresponding redundant electrode pair is in the same pixel driving unit as the micro light-emitting diode chip with abnormal light emission, so as to realize redundancy repair function. When the redundancy repair is completed, the display panel may also be encapsulated and undergo other processes. The specific encapsulation process is well-known in the art and is not repeated herein.

In this embodiment, the display panel prepared by the preparation method features a high yield and achieves high PPI.

What is claimed is:

1. A driving back plate, comprising a plurality of pixel driving units arranged in an array, wherein
   at least one pixel driving unit of the plurality of pixel driving units each comprises a main electrode pair and at least one redundant electrode pair, wherein the main electrode pair and the at least one redundant electrode pair are each configured to be bound to a micro light-emitting diode chip;
   for the main electrode pair and the at least one redundant electrode pair of the at least one pixel driving unit, a second electrode of the main electrode pair, a first electrode of the main electrode pair, a first electrode of the redundant electrode pair, and a second electrode of the redundant electrode pair are arranged sequentially in a first direction;
   the at least one pixel driving unit each comprises a connection line extending in the first direction, wherein the connection line is electrically connected to the first electrode of the main electrode pair and the first electrode of the redundant electrode pair respectively, the connection line comprises a cutting portion, and a signal on the connection line is input between the redundant electrode pair and the cutting portion; and
   wherein the plurality of pixel driving units are arranged in pixel columns in the first direction and arranged in pixel rows in a second direction;
   wherein the driving back plate further comprises a plurality of first electrode wires extending in the second direction; and wherein among the plurality of pixel driving units, connection lines of pixel driving units in a same row of the pixel rows are connected to a same first electrode wire of the plurality of first electrode wires, and connection lines of pixel driving units in different rows of the pixel rows are connected to different first electrode wires of the plurality of first electrode wires, wherein the first electrode of the redundant electrode pair is electrically connected to a corresponding first electrode wire, and the signal on the connection line is input through the corresponding first electrode wire.

2. The driving back plate according to claim 1, wherein the plurality of pixel driving units are arranged in pixel columns in the first direction and arranged in pixel rows in a second direction;
   the driving back plate comprises a plurality of first electrode wires extending in the second direction and a plurality of second electrode wires extending in the first direction;
   among the plurality of pixel driving units, connection lines of pixel driving units in a same row of the pixel rows are connected to a same first electrode wire of the plurality of first electrode wires, and connection lines of pixel driving units in different rows of the pixel rows are connected to different first electrode wires of the plurality of first electrode wires, wherein the first electrode of the redundant electrode pair is electrically connected to a corresponding first electrode wire, and the signal on the connection line is input through the corresponding first electrode wire; and
   among the plurality of pixel driving units, second electrodes of main electrode pairs and second electrodes of redundant electrode pairs in pixel driving units in a same column of the pixel columns are both electrically connected to a same second electrode wire of the plurality of second electrode wires, second electrodes of main electrode pairs in pixel driving units in different columns of the pixel columns are electrically connected to different second electrode wires of the plurality of second electrode wires, and second electrodes of redundant electrode pairs in pixel driving units in different columns of the pixel columns are electrically connected to different second electrode wires of the plurality of second electrode wires.

3. The driving back plate according to claim 2, wherein in a thickness direction of the driving back plate, a ratio of a distance between an orthographic projection of the connection line and an orthographic projection of a second electrode wire of the plurality of second electrode wires adjacent to the connection line to a distance between the orthographic projection of the connection line and an orthographic projection of another second electrode wire of the plurality of second electrode wires adjacent to the connection line is ranged from 0.1 to 10.

4. The driving back plate according to claim 2, wherein a portion of the corresponding first electrode wire is also served as the first electrode of the redundant electrode pair electrically connected to the corresponding first electrode wire.

5. The driving back plate according to claim 2, wherein the plurality of first electrode wires and the plurality of second electrode wires are arranged in a same layer.

6. The driving back plate according to claim 2, wherein the driving back plate further comprises an insulating layer located at an overlap position between the plurality of first electrode wires and the plurality of second electrode wires.

7. The driving back plate according to claim 1, wherein the driving back plate further comprises a plurality of second electrode wires extending in the first direction.

8. The driving back plate according to claim 7, wherein among the plurality of pixel driving units, second electrodes of main electrode pairs and second electrodes of redundant electrode pairs in pixel driving units in a same column of the pixel columns are both electrically connected to a same second electrode wire of the plurality of second electrode wires, second electrodes of main electrode pairs in pixel driving units in different columns of the pixel columns are electrically connected to different second electrode wires of the plurality of second electrode wires, and second electrodes of redundant electrode pairs in pixel driving units in different columns of the pixel columns are electrically connected to different second electrode wires of the plurality of second electrode wires.

9. The driving back plate according to claim 1, wherein the driving back plate further comprises a plurality of pixel driving circuits in one-to-one correspondence with the plurality of pixel driving units.

10. The driving back plate according to claim 9, wherein the first electrode of the redundant electrode pair is electrically connected to a corresponding pixel driving circuit of the plurality of pixel driving circuits.

11. The driving back plate according to claim 9, wherein in a thickness direction of the driving back plate, an orthographic projection of the connection line and an orthographic projection of a corresponding pixel driving circuit are at least partially non-overlapping.

12. The driving back plate according to claim 9, wherein the driving back plate further comprises a plurality of signal lines extending in the first direction.

13. The driving back plate according to claim 12, wherein in a thickness direction of the driving back plate, a ratio of a distance between an orthographic projection of the connection line and an orthographic projection of a signal line of the plurality of signal lines adjacent to the connection line to a distance between an orthographic projection of the connection line and an orthographic projection of another signal line of the plurality of signal lines adjacent to the connection line is ranged from 0.1 to 10.

14. A display panel, comprising the driving back plate according to claim 1 and a plurality of micro light-emitting diode chips, wherein a micro light-emitting diode chip of the plurality of micro light-emitting diode chips is bound to a corresponding main electrode pair or to a corresponding redundant electrode pair.

15. The display panel according to claim 14, wherein the plurality of micro light-emitting diode chips comprise a red micro light-emitting diode chip, a green micro light-emitting diode chip, and a blue micro light-emitting diode chip.

16. The display panel according to claim 14, wherein the plurality of micro light-emitting diode chips comprise a blue micro light-emitting diode chip.

17. A preparation method for a display panel, comprising:

binding each micro light-emitting diode chip of a plurality of micro light-emitting diode chips to a main electrode pair on a driving back plate, wherein the driving back plate comprises a plurality of pixel driving units arranged in an array, at least one pixel driving unit of the plurality of pixel driving units each comprises a main electrode pair and at least one redundant electrode pair, wherein the main electrode pair and the at least one redundant electrode pair are each configured to be bound to a micro light-emitting diode chip of the plurality of micro light-emitting diode chips; for the main electrode pair and the at least one redundant electrode pair of the at least one pixel driving unit, a second electrode of the main electrode pair, a first electrode of the main electrode pair, a first electrode of the redundant electrode pair, and a second electrode of the redundant electrode pair are arranged sequentially in a first direction; and the at least one pixel driving unit each comprises a connection line extending in the first direction, wherein the connection line is electrically connected to the first electrode of the main electrode pair and the first electrode of the redundant electrode pair respectively, the connection line comprises a cutting portion, and a signal on the connection line is input between the redundant electrode pair and the cutting portion;

outputting a light-emitting signal to the plurality of micro light-emitting diode chips; and in response to abnormal light emission of a micro light-emitting diode chip of the plurality of micro light-emitting diode chips, cutting off a cutting portion corresponding to the micro light-emitting diode chip with abnormal light emission and binding a redundant electrode pair corresponding to the micro light-emitting diode chip with abnormal light emission to another micro light-emitting diode chip.

\* \* \* \* \*